(12) United States Patent
Kobayashi

(10) Patent No.: US 7,146,744 B2
(45) Date of Patent: Dec. 12, 2006

(54) METHOD AND APPARATUS FOR SURFACE TREATMENT

(75) Inventor: Yasuo Kobayashi, Nirasaki (JP)

(73) Assignee: Tokyo Electron Limited, Tokyo-To (JP)

( * ) Notice: Subject to any disclaimer, the term of this patent is extended or adjusted under 35 U.S.C. 154(b) by 150 days.

(21) Appl. No.: 10/832,439

(22) Filed: Apr. 27, 2004

(65) Prior Publication Data

US 2004/0194340 A1 Oct. 7, 2004

Related U.S. Application Data

(63) Continuation of application No. 09/655,787, filed on Sep. 6, 2000, now abandoned, which is a continuation of application No. PCT/JP99/05676, filed on Oct. 14, 1999.

(30) Foreign Application Priority Data

Oct. 14, 1998 (JP) ............................................ 10-291867

(51) Int. Cl.
   *F26B 19/00* (2006.01)

(52) U.S. Cl. .................. 34/62; 34/426; 34/443
(58) Field of Classification Search ...................... 34/74, 34/418, 426, 443, 510, 62, 191, 218, 72; 156/345.37, 345.48; 134/1, 1.1, 1.2, 1.3
See application file for complete search history.

(56) References Cited

U.S. PATENT DOCUMENTS

| | | |
|---|---|---|
| 4,816,638 A | 3/1989 | Ukai et al. |
| 5,342,471 A | 8/1994 | Fukasawa et al. |
| 5,350,480 A | 9/1994 | Gray |
| 5,395,474 A | 3/1995 | Suzuki et al. |
| 5,478,429 A | 12/1995 | Komino et al. |
| 5,614,055 A | 3/1997 | Fairbairn et al. |
| 5,772,832 A | 6/1998 | Collins et al. |
| 5,851,600 A | 12/1998 | Horiike et al. |
| 5,861,601 A * | 1/1999 | Sato et al. ............. 219/121.43 |
| 5,961,850 A | 10/1999 | Satou et al. |
| 5,976,308 A | 11/1999 | Fairbairn et al. |
| 5,989,345 A | 11/1999 | Hatano |
| 6,036,782 A * | 3/2000 | Tanaka et al. ............... 118/715 |
| 6,059,922 A | 5/2000 | Yamazaki et al. |

FOREIGN PATENT DOCUMENTS

| | | |
|---|---|---|
| JP | 1-200628 | 8/1989 |
| JP | 3-243688 | 10/1991 |
| JP | 4-181734 | 6/1992 |
| JP | 4-206526 | 7/1992 |
| JP | 6-196455 | 7/1994 |

* cited by examiner

Primary Examiner—Kenneth Rinehart
(74) Attorney, Agent, or Firm—Finnegan, Henderson, Farabow, Garrett & Dunner, L.L.P.

(57) ABSTRACT

The present invention provides method and apparatus for surface treatment which, when employed in process steps of manufacturing semiconductor devices, can result in the final products having enhanced reliability. According to the surface processing method, an obeject to be processed W is introduced in a processing vessel 10, which is then supplied with $ClF_3$ gas serving as cleaning gas from a supply unit 26. The $ClF_3$ gas is bound to the surface of the object to be processed W, and although the supply of the gas to the processing vessel is interrupted, the $ClF_3$ gas bound to the surface of the object to be processed W serves to clean the surface of the object to be processed. Next, reducing gas is introduced into the processing vessel W to remove chlorine from the object to be processed W, the chlorine being derived from the $ClF_3$ gas. After that, the introduction of the reducing gas is interrupted, and the cleaned object to be processed W is exported from the processing vessel 10. In addition to that, a surface processing apparatus 1 and other processing devices are arranged in a cluster device so that an object to be processed therein is transported among them from one to another under a vacuum environment.

3 Claims, 8 Drawing Sheets

METHOD AND APPARATUS FOR SURFACE TREATMENT

CROSS-REFERENCE TO RELATED APPLICATIONS

This application is a continuation of U.S. patent application Ser. No. 09/655,787, filed Sep. 6, 2000 now abandoned, which is a continuation of international application No. PCT/JP99/05676, filed Oct. 14, 1999 and claims the benefit of Japanese application No. 10-291867, filed Oct. 14, 1998. The content of all three applications is incorporated herein by reference.

FIELD OF THE INVENTION

The present invention relates to a method and apparatus for surface treatment which processes a object to be processed, such as semiconductor wafer.

BACKGROUND ART

In general, in fabricating semiconductor integrated circuits (semiconductor devices), substrates such as semiconductor wafers as object to be processed under treatment repetitively undergo predetermined procedures of film formation and pattern etching to build a number of desired devices.

During a variety of process steps applied to a object to be processed (substrate), the object, such as semiconductor wafer (hereinafter referred to as "wafer(s)"), had to be transported among processing units from one to another, and the wafers were unavoidably exposed to the atmospheric air during transport. Certain portions of wafer surfaces exposed to the atmospheric air (e.g., exposed portions of silicon substrates at the bottoms of contact-holes, or exposed portions of metal layers at the bottoms of through-holes) often got into reaction with oxygen and moisture in the air, and made native oxide films. There was also the possibility of producing chemical oxides on exposed surfaces due to reactions of such exposed portions with chemicals during wet cleaning (e.g., RCA cleaning). Additionally, there was another possibility that wafer surfaces were contaminated with substances such as metals during the transport of the wafers among the processing steps and among processing units.

Such oxides including native oxide films and chemical oxides (referred to as "native oxides" hereinafter) and metal contaminants degrade semiconductor properties such as electric properties, and thus, it has been usual to perform surface treatment to the wafer surfaces to remove the oxides and metal contaminants from them and clean them.

A typical technique conventionally employed as surface treatment to remove native oxide films and other undesired substances was wet cleaning (e.g. RCA cleaning) which immersed wafers in a liquid chemical such as HF solution to remove native oxide films and others. However, along with progressively increased density of integration and miniaturization of semiconductor devices, their dimensions including line widths and diameters of contact-holes are getting more and more miniaturized, which results in, for example, increasing aspect ratios of contact-holes and reducing their diameters to an extent around 0.2 to 0.3 µm or even smaller (e.g., 0.12 µm). Miniaturization to that extent caused the problems that liquid chemicals failed to sufficiently impregnate minute contact-holes, or on the contrary, liquid chemicals in the contact-holes could not go out therefrom due to their surface tensions. These problems sometimes led to the fatal disadvantage that native oxide films developed at the bottoms of the contact-holes could not be sufficiently removed.

In treating a multi-layered structure through the wet cleaning, since its respective layers exposed along walls of contact-holes made therethrough were different in etching rate, it caused further problems, such as irregularities in level of the wall surfaces of the contact-holes.

Figure 8A:
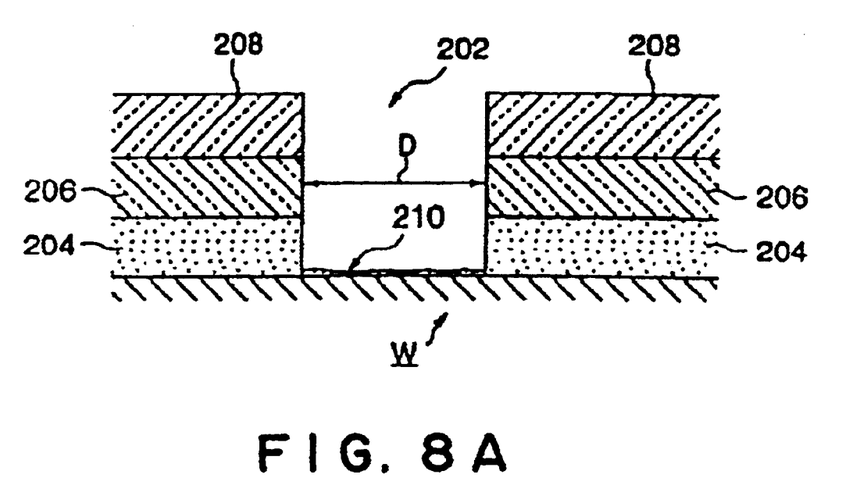
Figure 8B:
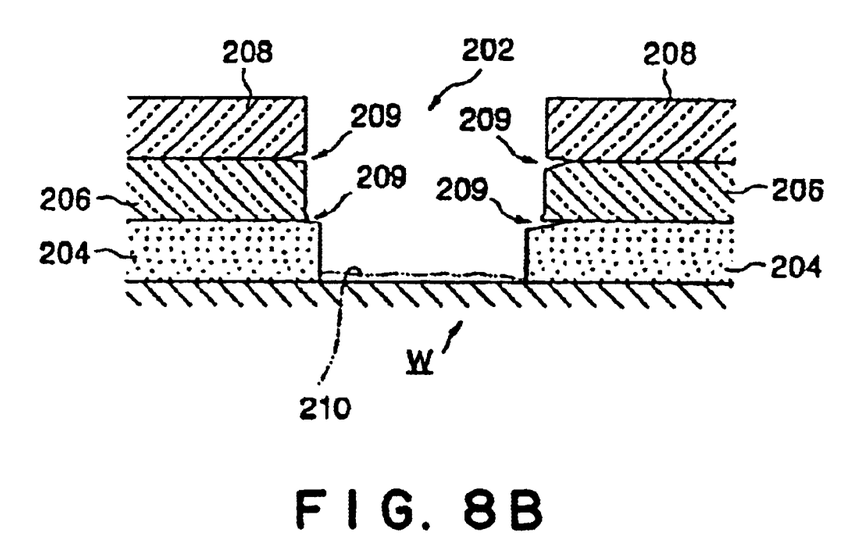

FIGS. 8A and 8B of attached drawings illustrate a contact-hole 202 for making electrical contact to a drain and a source formed on a surface of a wafer W of silicon (Si), for example. Hole diameter D shown in FIG. 8A is in the range from 0.2 to 0.3 µm, approximately. Multi-layered wall surfaces of the hole 202 are defined by silicon oxide films ($SiO_2$) of three layers, for example, which are stacked in different film formation steps. For example, the first $SiO_2$ film 204 is formed by thermal oxidization on the surface of the wafer W the second $SiO_2$ film 206 is made of phosphor-doped glass by spin coating, and the third $SiO_2$ film 208 is made of silica glass. In addition to that, as shown in FIG. 8A, a native oxide film 210 is produced at the bottom of the contact-hole 202.

In such a three-layer-stacked layer, the $SiO_2$ films 204, 206 and 208 are different in etching rate relative to a liquid chemical during wet cleaning. After the native oxide film 210 is removed by the wet cleaning, as shown in FIG. 8B, irregularities 209 are produced due to differences in etching rate, or border areas between adjacent layers where the liquid chemical can seep more easily are excessively eroded (see notches in the drawing). This is also a problem involved in the conventional wet-cleaning technique.

To overcome the above-mentioned disadvantages in the existing wet-cleaning technique, various alternative methods called dry-cleaning techniques (etching techniques) have been proposed as a replacement for wet-cleaning techniques relying on liquid chemicals, which used an etching gas to remove native oxide films (see, for example, Japanese Patent Laid-Open Publication No. hei 4-206526 and Japanese Patent Laid-Open Publication No. hei 6-196455).

Typically used is sputter etching with argon gas and $H_2$ gas as a method of removing native oxide films by dry cleaning.

In a method for burying through holes of semiconductor wafers with a metal as disclosed in Japanese Patent Laid-Open Publication No. hei 4-206526 referred to above, native oxide films or others are removed by pre-treating base metals partially exposed in a preliminary processing chamber, especially treating oxidized films overlying the metal films by supplying and heating $ClF_3$ gas. Then that method transports the pre-treated wafers from the preliminary processing chamber to a film deposition chamber by a transport means without exposing them to the atmospheric air to conduct selective CVD of metals.

In the method of processing the wafers as disclosed in the above-identified Japanese Patent Laid-Open Publication No. hei 6-196455, wafers are placed in an atmosphere of a mixed gas of $ClF_3$ and $H_2$, and ultraviolet rays are irradiated to the mixed gas to thereby remove native oxide films produced on the wafers without heating the wafers.

However, the prior art sputter etching techniques relying on argon gas and hydrogen gas had the possibility of damaging contacts in the wafers, and there was the demand for a dry-cleaning technique using a low energy.

Additionally, the known cleaning technique using $ClF_3$ gas involved the following problems:

That is, there was the problem that chlorine, derived from the ClF$_3$ gas used for the cleaning, corroded metal films and others on wafers, and the resultant products of the semiconductor devices were degraded in yield and reliability. Since ClF$_3$ gas is a chlorine-contained gas, after wafer surfaces were cleaned by using ClF$_3$ gas, chlorine remained on the wafers in form of chlorine atoms combined with silicon or metals existing on wafer surfaces, for example, and the residual chlorine corrode metal films and others (as wirings of semiconductor devices, for example) formed on the wafers. Therefore, it invited deterioration of electrical properties of semiconductor, and degraded the reliability and yield of semiconductor devices as finished products.

Furthermore, there was the problem that reaction by the ClF$_3$ gas excessively progressed, inviting damages to wafers and degradation of the yield and reliability of semiconductor devices as finished products. More specifically, after wafer surfaces were cleaned by using ClF$_3$ gas, not only native oxides but also insulating films of SiO$_2$ and metal films of Al intentionally formed on the wafers were undesirably etched by reaction with the ClF$_3$ gas. When insulating films serving as interlayer insulating films in semiconductor devices and metal films serving as wiring in semiconductor devices are excessively etched, the resultant semiconductor devices degrade in electrical properties, and this inevitably results in decreasing the reliability and yield of semiconductor devices as final products.

The present invention is directed to overcoming the above-mentioned problems involved in the conventional cleaning technique for object surfaces to be processed, and it is an object of the present invention to provide a surface processing method and an apparatus therefor, which can improve the reliability of final products when used in process steps of manufacturing semiconductor devices.

DISCLOSURE OF INVENTION

To attain the above-mentioned object, the invention is characterized in comprising a step of cleaning a surface of an object to be processed by using ClF$_3$ gas; and removing chlorine derived from the ClF$_3$ gas still remaining on the surface of the object under treatment even after the step of cleaning the surface.

The invention is characterized in that the step of removing chlorine includes a step of removing chlorine from the surface of the object to be processed by using a reducing gas.

The invention is characterized in that the reducing gas is H$_2$ gas.

The invention is characterized in comprising the steps of making ClF$_3$ gas adhere to a surface of an object to be processed by supplying the ClF$_3$ gas to the surface of the object to be processed; interrupting the supply of the ClF$_3$ gas to the surface of the object to be processed; and cleaning the surface of the object to be processed by using the ClF$_3$ gas adhering to the surface of the object to be processed.

The invention is characterized in that the object to be processed is cooled to 20° C. or below in the step of making ClF$_3$ gas adhere to the surface of the object.

The invention is characterized in comprising a processing vessel in which an object to be processed is placed; a means for supplying a ClF$_3$ gas into the processing vessel; a means for activating the ClF$_3$ gas supplied in the processing vessel; and a means for supplying a reducing gas into the processing vessel.

The invention is characterized in comprising a processing vessel in which an object to be processed is placed; a means for supplying ClF$_3$ gas into the processing vessel; a means for promoting adhesion of ClF$_3$ gas to the object to be processed; and a means for activating ClF$_3$ gas supplied in the processing vessel.

The invention is characterized in further comprising a mount located in the processing vessel to set the object to be processed thereon.

The invention is characterized in that the means for promoting adhesion of the ClF$_3$ gas to the object to be processed is provided in the mount to function to cool the object to be processed on the mount.

The invention is characterized in that the means for activating the ClF$_3$ gas heats the object to be processed in a heating position distant from the object setting position for setting the object on the mount.

The invention is characterized in further comprising a means for elevating and lowering the object to be processed between the object setting position and the heating position.

The invention is characterized in comprising the surface processing apparatus; a transport chamber capable of maintaining a non-reactive atmosphere inside and capable of transporting an object to be processed in the non-reactive atmosphere to and from the surface processing apparatus; and one or more processing apparatuses capable of transporting the object to be processed to and from the transport chamber.

The invention is characterized in that the processing apparatus is a metal wiring formation chamber for making metal wiring on the object to be processed.

BRIEF DESCRIPTION OF DRAWINGS

FIGS. 2A and 2B show a wafer lifting mechanism used in the surface processing apparatus shown in FIG. 1, in which FIG. 2A is a plan view and FIG. 2B is a side elevation.

FIGS. 3A and 3B illustrate variations of a ClF$_3$ gas supply unit (shower head) used in the surface processing apparatus in FIG. 1, in which FIG. 3A is a plan view of a ring-shaped shower head and FIG. 3B is a plan view of a lattice-shaped shower head, both of which are viewed from a wafer mount.

FIGS. 5A, 5B, and 5C are diagrams that show process steps of a preferred embodiment of the surface processing method according to the present invention, in which FIG. 5A is an enlarged view of a native oxide bound to the wafer, FIG. 5B is an enlarged view of ClF$_3$ gas bound to the wafer, and FIG. 5C is an enlarged view of residual chlorine going to be removed by reducing gas (H$_2$ gas) which is activated by plasma.

FIGS. 6A and 6B illustrate another example of the wafer mount, in which FIG. 6A is a plan view thereof and FIG. 6B is a front sectional view thereof.

FIGS. 8A and 8B are diagrams illustrating a prior art surface processing method for removing native oxide films, in which FIG. 8A is an enlarged view of a native oxide film produced on and bound to the bottom of a contact-hole of the wafer, and FIG. 8B is an enlarged view of irregularities produced along side walls of the contact-hole.

BEST MODES FOR CARRYING OUT THE INVENTION

An embodiment of the method and the apparatus for surface treatment therefor according to the present invention is explained below in detail with reference to the attached drawings.

Configuration of the Apparatus for Surface Treatment

Figure 1:
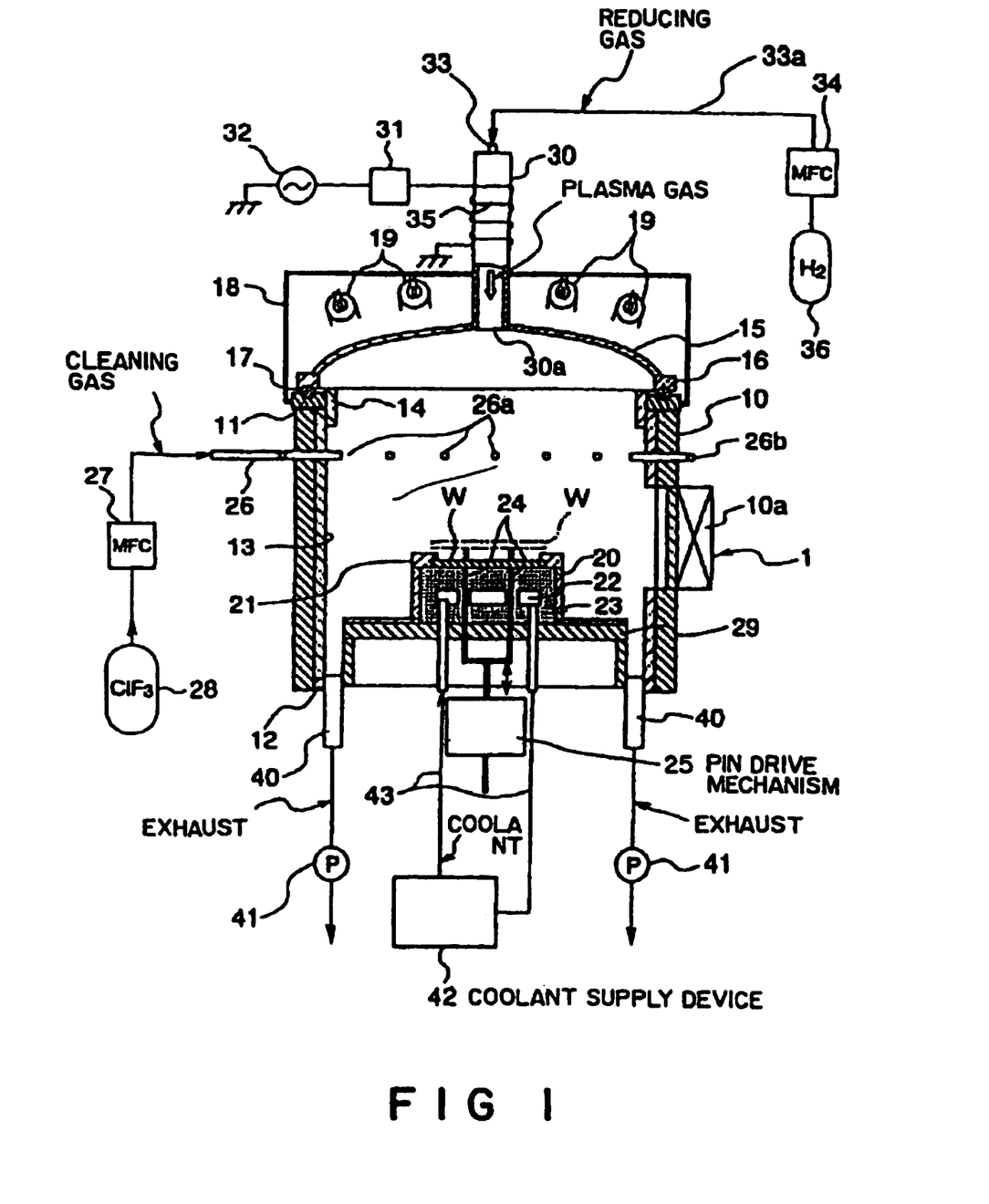
FIG. 1 is a diagram that shows schematic configuration of a preferred embodiment of the surface processing apparatus according to the present invention.

FIG. 1 is a diagram that shows schematic configuration of a preferred embodiment of the apparatus for surface treatment according to the present invention. The apparatus for surface treatment (cleaning device) 1 shown in FIG. 1 is used to clean surfaces of wafers W (object to be processed) having contact-holes 202 (see FIG. 8A) formed therein in a manufacturing process of semiconductor devices, for example. Removed in the cleaning procedure are oxides (hereinafter referred to as "native oxide(s)") such as native oxide films developed on a bottom surface of the contact-hole 202 or other chemical oxides having grown to a thickness around 10 to 20 Angstrom, and contaminants such as metals adhered to the bottom surface and side walls of the contact-hole 202.

The surface processing apparatus 1 is primarily comprised of a plasma developing pipe 30 which activates reducing gas such as H2 gas into plasma ions, a processing (reaction) vessel 10 which is loaded with the object to be processed or the wafer W and executes predetermined surface processing to clean the surface of the wafer, and a cleaning gas supply conduit 26 which supplies the processing vessel 10 with $ClF_3$ gas as the cleaning gas.

The processing vessel 10 is made of aluminum material and has inner walls coated with quartz ($SiO_2$) linings 13 and 14 to protect the wafer W from contamination by metals and protect the aluminum surface from corrosion. The processing vessel 10 is a cylindrical housing having a circular, square, or octagonal cross-section.

The processing vessel 10 has its bottom fitted with a bottom panel 12 of a predetermined thickness, and a base 29 having its surface covered with quartz is placed on the bottom plate 12. A cylindrical wafer mount 20 stands on the base 29, which is entirely covered with quartz except for its portion to place the wafer on. On an approximately horizontal upper surface of the wafer mount 20, the object to be processed or the wafer W is held by a clamp ring 21 made of quartz. Moreover, the cylindrical mount 20 houses a heat exchanger 23 that has a jacket (or a pipe) loaded with a coolant (chiller), and the coolant is supplied from a coolant supply device 42 into the jacket (or the pipe) 22 through a cooling path 43 to circulate in a cooling system, thereby to cool down the wafer W to a desired temperature such as 20° C. or below.

Figure 2A:
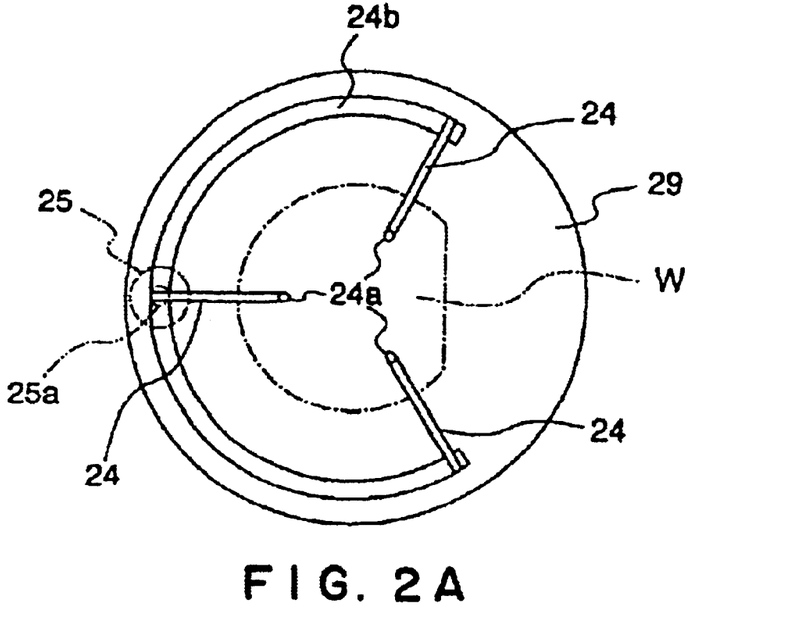
Figure 2B:
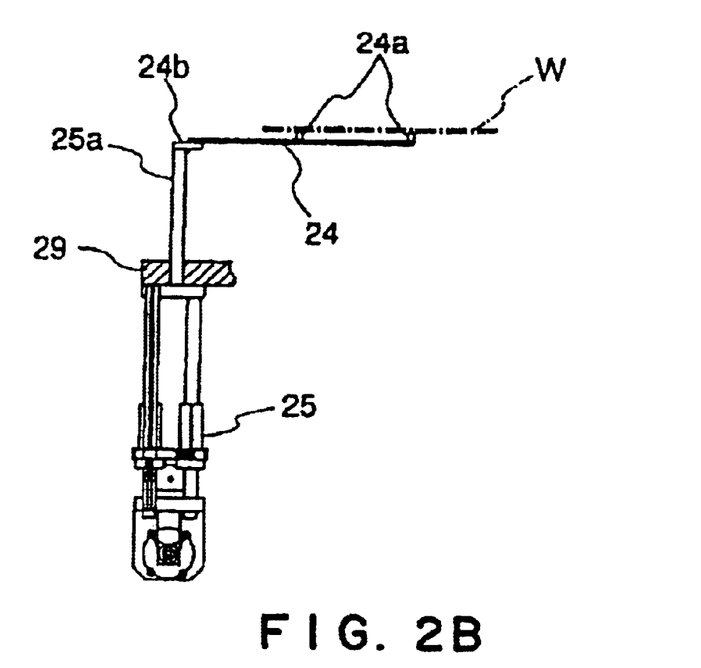

Also provided in the mount 20, a wafer lift means 24 controlled in up and down motion by a pin drive mechanism 25 that functions to raise the wafer put on the mount to a heating position distant from the wafer mount portion on the mount 20 upon heating it, as explained later. The wafer lift means 24 is configured as shown in FIGS. 2A and 2B, and a hydraulic cylinder 25 (pin drive mechanism) is placed on a lower surface of the base 29 in the mount 20 at a lower part of the processing vessel 10, and a U-shaped support member 24b is fixed to the tip of a cylinder rod 25a of the hydraulic cylinder. Support pins 24a are provided, with their respective distal tips projecting upward and their respective proximal ends fixed at several points (e.g., three points) to an arm 24 extending from the support member 24b in radial directions, so as to support the wafer W at the three points to keep the wafer approximately horizontal. When the wafer is heated by heating lamps 19, the hydraulic cylinder 25 is actuated to raise the wafer W to the heating position as mentioned above.

As shown in FIG. 1, there are four exhaust pipes 40 in a peripheral region of the bottom panel 12 fitted in the bottom of the processing vessel 10 such that the processing vessel 10 is evacuated by an exhaust means 41 such as vacuum pump connected to the exhaust pipes 46, respectively.

In an upper portion of the processing vessel 10, a top panel 11 of aluminum material is fixed, and a quartz dome (cover) 15 having a flange 16 is stacked thereon via a seal member 17 such as O-ring. Since the dome 15 is integrated with a quartz plasma developing pipe 30, the dome 15 is merely required to have a mechanical strength enough to support them, and it may be configured in a flat quartz plate, not limited to the dome shape.

In a seal region where the seal member 17 is attached, a pressure sensor, and other devices, are provided to monitor the fastening pressure in the seal region and gas leakage from the seal region.

A plurality of heating lamps 19 are provided above the dome 15 to heat the wafer W from above it to activate the $ClF_3$ gas on the wafer W. These heating lamps 19 may be halogen lamps enabling quick increase of the temperature such that heat rays emitted from the heating lamps 19 pass through the transparent quartz dome 15 and impinge the surface of the wafer W raised to the above-mentioned heating position to heat the wafer W to a desired temperature such as 150° C. or below.

The heating lamps 19 are covered with a cover 18 made of a material such as metal to block heat rays and light beams from the heating lamps 10 to the exterior, and this cover effectively prevents the cleaning gas such as $ClF_3$ or $H_2$ and the reducing gas from spreading and flooding to the exterior even if the quartz dome 15 is broken.

Alternatively, a light source for emitting ultraviolet rays may be used to activate the $ClF_3$ gas.

A gate valve 10a is formed through a side wall of the processing vessel 10, and it is opened and closed upon transporting the wafer W in and out. When the valve is opened, the processing vessel communicates with the transport chamber. Inner walls of the gate valve 10a are coated with protective quartz.

Additionally, a plasma developing pipe 30 made of quartz, which is used to introduce reducing gas and activate the gas into plasma ions, is integrally united to the quartz dome 15 at its upper center portion by welding and opens to the processing vessel 10 at the center of the dome 15.

Connected to an upper end of the plasma developing pipe 30 is a reducing gas introducing member 33 for introducing $H_2$ gas as the reducing gas into the plasma developing pipe 30, which is configured to supply $H_2$ gas from a $H_2$ gas source 36 through a mass flow controller (MFC) 34 to a gas flow path 33a, and then supply it as a reducing gas to a plasma developing unit of the plasma developing pipe 30 wound with an induction coil 35.

Connected to the induction coil 35 is a radio frequency power source 32 for generating radio frequency waves (RF waves) of 13.56 MHz, for example, via a matching circuit 31 for impedance matching. The induction coil 35 is supplied with radio frequency power. As a result, the reducing gas supplied to the plasma developing unit is changed into plasma, and supplied as an active gas seed from the opening 30a of the plasma developing pipe 30 to the processing vessel 10.

Alternatively, a microwave discharge tube may be used as the plasma developing source.

Below the opening 30a of the plasma developing pipe 30, there are provided gas jets 26a (preferably arranged in an approximately horizontal plane, i.e. a plane substantially parallel to the surface of the wafer W set on the mount 20, in substantially equal intervals) to supply $ClF_3$ gas as a cleaning gas into the processing vessel. The gas jets ($ClF_3$ gas supply portions) 26a are connected to the conduit 26 via a ring-shaped tube 26b arranged along the outer circumferential wall of the processing vessel 10, and the conduit 26 is connected to a $ClF_3$ gas source 28 via the mass flow controller (MFC) 27 to supply the $ClF_3$ gas thorough the gas jets 26a to the processing vessel 10 at a desired flow rate.

Referring to FIG. 1, although the gas jets 26a are depicted as openings at the tips of tubular objects which slightly project inward from the inner wall surface of the processing vessel 10, they may be direct openings of the inner wall surface of the processing vessel 10.

Figure 3A:
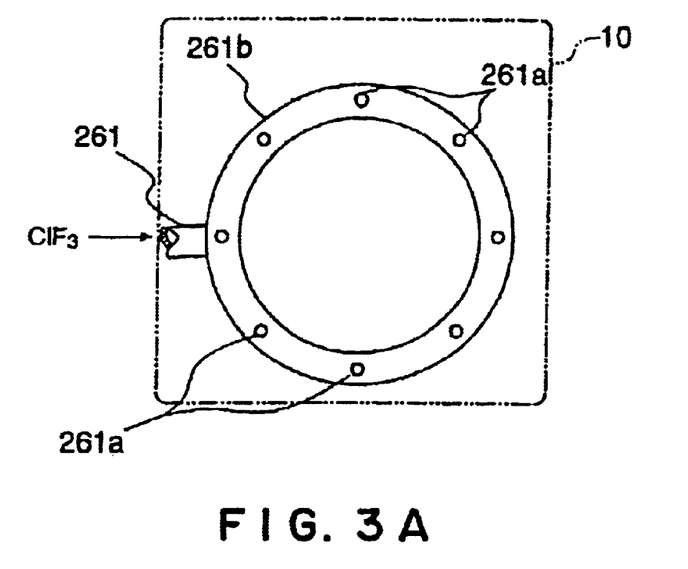

As shown in FIG. 3A, by making a quartz ring-shaped shower head 261b having formed a plurality of gas jets 216a along its circumferential area (preferably arranged in substantially equal intervals along the circumferential area) to open downward, and connecting a conduit 261 to the ring-shaped shower head 261b, this structure may be set in position (preferably, approximately horizontally) within the processing vessel 10 to supply the $ClF_3$ gas to the processing vessel 10.

Figure 3B:
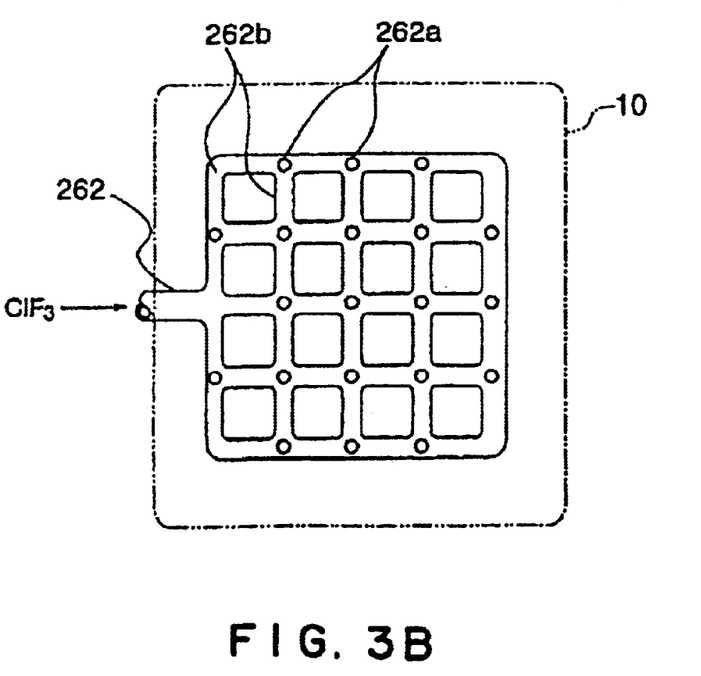

Furthermore, as shown in FIG. 3B, by making a lattice-shaped shower head 262b having formed a plurality of gas jets 262a to open at predetermined positions (preferably aligned in substantially equal intervals on the lattice), and connecting a conduit 262 to the lattice-shaped shower head 262b, this structure may be set in position (preferably, approximately horizontally) within the processing vessel 10 to supply the $ClF_3$ gas to the processing vessel 10.

As stated above, by configuring the $ClF_3$ gas supply means to have a plurality of gas jets, it is possible to supply the $ClF_3$ gas in form of a shower from the gas jets into the processing vessel 10 and to uniformly pour the gas onto the wafer W put on the mount 20.

Mode of the Surface Processing Method

Figure 4:
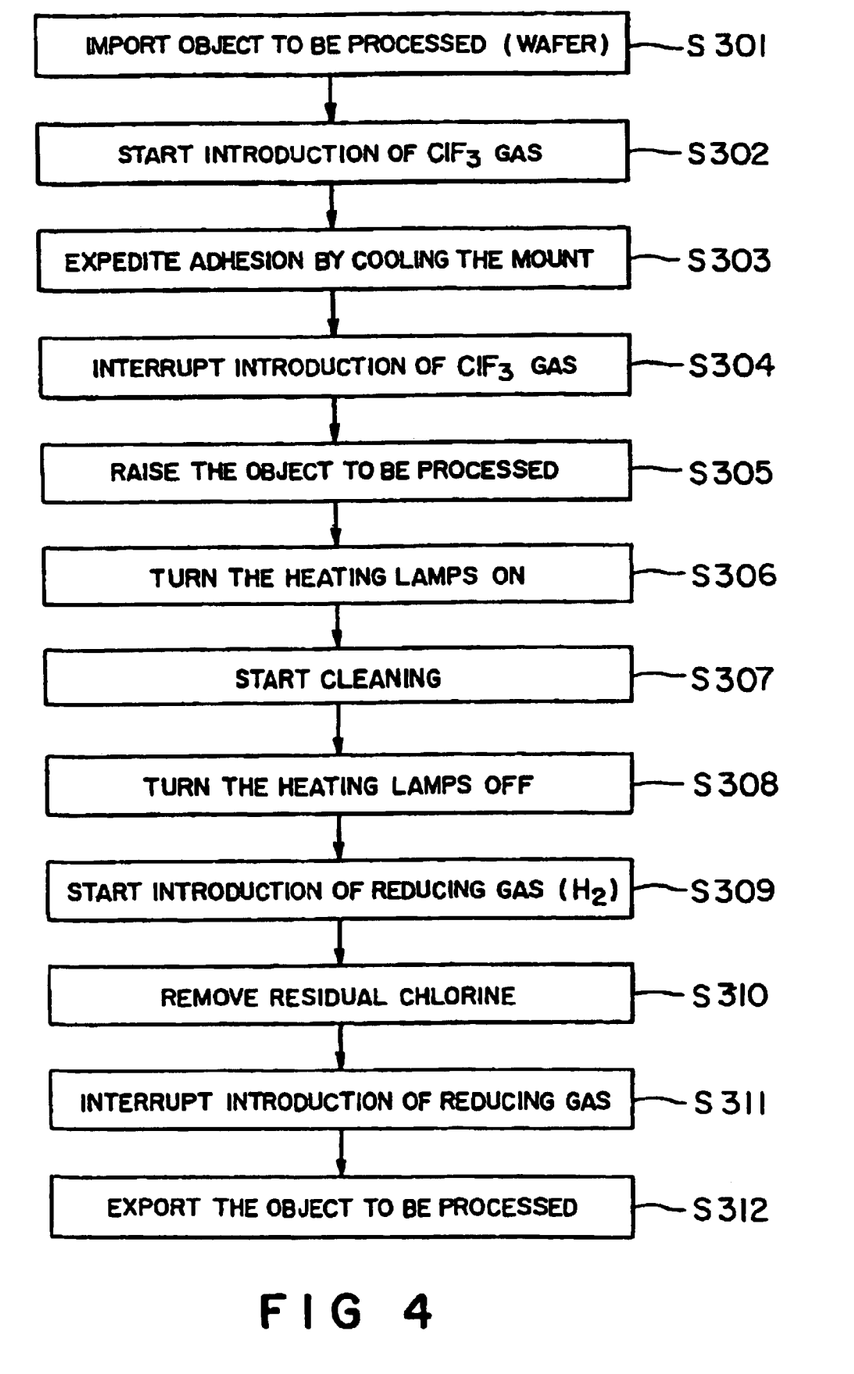
FIG. 4 is a flow chart that shows process steps of a preferred embodiment of the surface processing method according to the present invention.

Next explained is a surface processing (cleaning) method using the surface processing (cleaning) apparatus 1 having the above-explained configuration as an embodiment of the surface processing method according to the present invention, with reference to FIG. 4 (flowchart).

In the surface processing apparatus 1 shown in FIG. 1, the vacuum pumps 41 are first actuated to evacuate the processing vessel 10 through the exhaust pipes 40 to make a vacuum atmosphere (e.g., 1 to 3 Torr).

Then, the gate valve 10a is opened to import a wafer W as an object to be processed into the processing vessel 10 from an adjacent vacuum transport chamber, for example. After the wafer W is set on the mount 20, the gate valve 10a is closed, and the clump ring 21 is actuated to hold the wafer W on the mount 20 (Step S301). At that time, the contact-hole 202 (FIG. 7) is already formed in the wafer W in a preceding step, and a native oxide 80 of a thickness around 10 to 20 Angstrom overlies the bottom surface of the hole.

After that, the $ClF_3$ (chlorine trifluoride) gas controlled in flow rate to a desired value by the mass flow controller (MFC) 27 is supplied to the cleaning gas supply conduit. Then the $ClF_3$ gas is showered from the gas jets 26a opening into the processing vessel 10 so as to uniformly flow down onto the wafer W set on the mount 20 (Step S302).

Figure 5A:
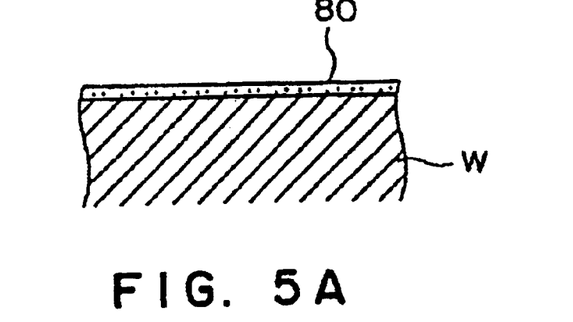
Figure 5B:
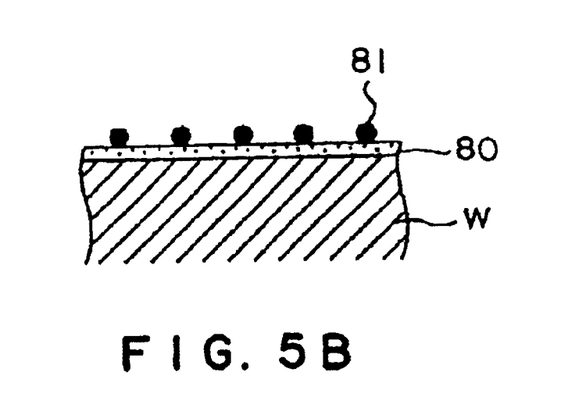

At that time, the coolant supply device 42 shown in FIG. 1 is actuated to supply the coolant (e.g., ethylene glycol) into the mount 20 and cool it there, thereby to cool the wafer on the mount 20. Since the wafer W on the mount 20 is already cooled, adhesion of the $ClF_3$ gas to the wafer W is promoted, and the wafer W adsorbs the $ClF_3$ gas well (Step S303). According to experiments by the Inventor, the $ClF_3$ gas does not decompose substantially in the temperature range where the surface temperature of the wafer W is 100° C. or lower, and only a small amount thereof is adsorbed onto the surface of the wafer W. In contrast, when the surface temperature of the wafer W is low, amount of the adsorbed $ClF_3$ gas increases. Thus, in order to ensure efficient adsorption of the $ClF_3$ gas onto the surface of the wafer W, the wafer W is preferably cooled to 20° C. or lower in terms of its surface temperature. In this way, as shown in FIG. 5B, the $ClF_3$ gas 81 is bound to the wafer W.

After that, introduction of the $ClF_3$ gas into the processing vessel 10 is interrupted (Step S304). At this point, the processing vessel 10 is in an evacuated condition.

At the room temperature the $ClF_3$ gas hardly reacts (the native oxide 80 and other substances are not removed, and the surface of the wafer W is not cleaned). In this status, the clamp ring 21 is activated to release the wafer W from the mount 20, and the wafer lift means 24 is driven to raise the wafer W to the above-mentioned heating position (Step S305). Then, the heating lamps 19 as the heating means are turned on to heat the wafer W from above. In this way, temperature of the wafer W is quickly raised from the room temperature to a desired temperature such as 150° C. (Step S306).

As a result of the quick rise in temperature of the wafer W by the heating lamps 19 to 150° C., the $ClF_3$ gas bound to the wafer W is thermally decomposed and activated on the surface of the wafer. Thus the native oxide 80 and other undesired substances are removed from the surface of the wafer W, and the surface of the wafer W is cleaned (Step S307). After the cleaning, the heating lamps 19 are turned off (Step S308).

Figure 5C:
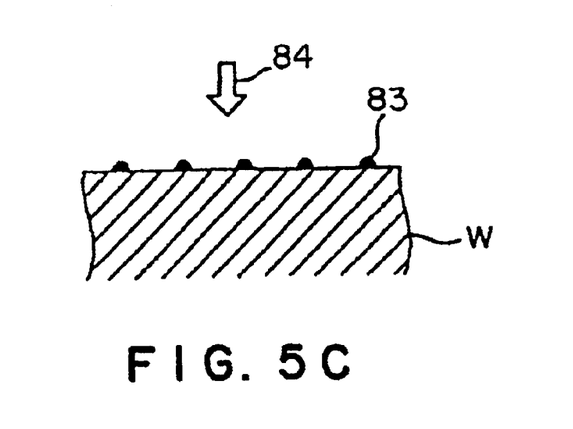

After the surface of the wafer W is cleaned with $ClF_3$ gas in this manner, as shown in FIG. 5C, chlorine 83 derived from the $ClF_3$ gas used as a cleaning gas remains on the surface of the wafer W in form of chlorine atoms bonding to other atoms that make up the surface of the wafer.

Taking it into account, $H_2$ gas is supplied as a reducing gas from the $H_2$ gas source 36 shown in FIG. 1 to the gas flow path 33a via the mass flow controller 34. By supplying the induction coil 35 with radio frequency power, the $H_2$ gas supplied into the gas flow path 33a is activated into plasma ions inside the plasma developing pipe 30, and they flows down as an active gas species through the opening 30a of the plasma developing pipe 30 to the wafer W residing in the processing vessel 10 (Step S309). Then, as shown in FIG. 5C, the $H_2$ reducing gas 84 removes the residual chlorine 83 on the wafer W from its surface by its reducing function (Step S310).

Removal of the residual chlorine by using the reducing gas may be performed in a chamber other than the processing vessel 10. Alternatively, by introducing the reducing gas, without activating it into plasma, into the processing vessel 10 and heating the wafer W to a predetermined temperature with the heating lamps 19, the residual chlorine may be removed from the wafer W.

After that, introduction of the reducing gas is interrupted (Step S311). At this point, the processing vessel 10 is held in an evacuated condition.

Finally, the gate valve 10a is opened, and the wafer W with its surface cleaned is transported from the processing vessel 10 and sent back to an adjacent vacuum transport chamber, for example (Step S312). Then, after the gate valve 10a is closed, the wafer W is delivered to the next step, e.g. the heating chamber adjacent to the vacuum transport chamber, by a transport robot or the like.

In the surface processing method as described above, the $ClF_3$ gas is applied to the surface of the wafer W to adhere the $ClF_3$ gas to the surface of the wafer W, and after the supply of the $ClF_3$ gas to the surface of the wafer W is interrupted, the $ClF_3$ gas adsorbed onto the surface of the wafer W is utilized to clean the surface of the wafer W. Thus, amount of the reactive $ClF_3$ gas can be limited to the amount of the gas adsorbed onto the surface of the wafer W or even below so as to control the progress of the reaction of the $ClF_3$ gas, and hence, excessive etching of films, such as insulating films and metal wiring films, stacked on the wafer W can be prevented.

Additionally, since the wafer W is cooled to 20° C. or below in terms of its surface temperature to expedite adsorption of the $ClF_3$ gas onto the wafer W, the $ClF_3$ gas is efficiently bound to the surface of the wafer W.

Furthermore, since the wafer W is raised to the heating position distant from the wafer mount portion on the mount 20 upon heating the wafer W, heat conduction between the mount 20 and the wafer W is restricted, and the wafer can be heated efficiently.

Further, since the surface of the wafer W is cleaned by using the $ClF_3$ gas and chlorine derived from the $ClF_3$ gas and left on the surface of the wafer W is removed by using a reducing gas, films such as metal films on the wafer W can be protected against corrosion caused by residual chlorine.

Moreover, since $H_2$ gas is used as the reducing gas, residual chlorine on the wafer reacts with the reducing gas to produce volatile hydrogen chloride as its reaction product, and this product can be easily drained out of the processing vessel.

The above mentioned surface processing method is applicable for removal of very thin oxides (about 10 to 20 Angstrom) grown on W, Ti, Al, Ni, Co or their silicide, in addition to the above-mentioned application for removal of native oxides produced on Si.

The above-mentioned surface processing method is suitable for an application of cleaning surfaces of wafers W where through-holes have been defined, as well as the application of cleaning surfaces of wafers W where the contact-holes have been defined.

Modified Embodiments of the Wafer Support Means

Figure 6A:
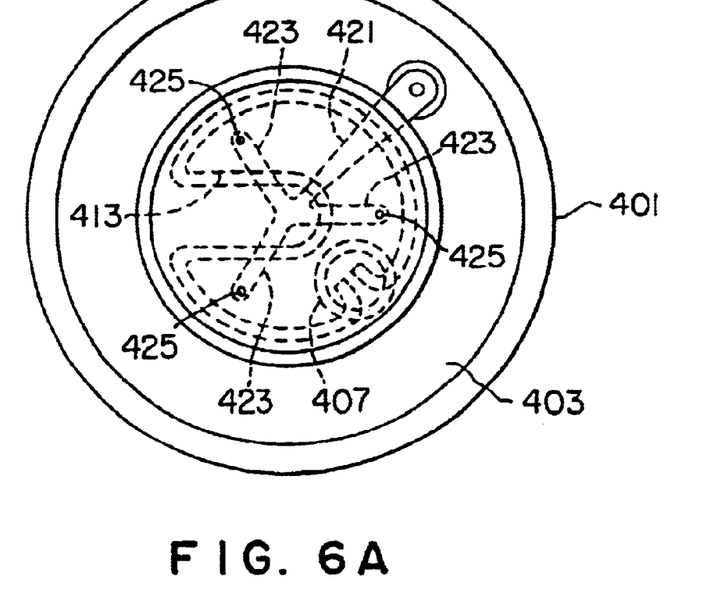
Figure 6B:
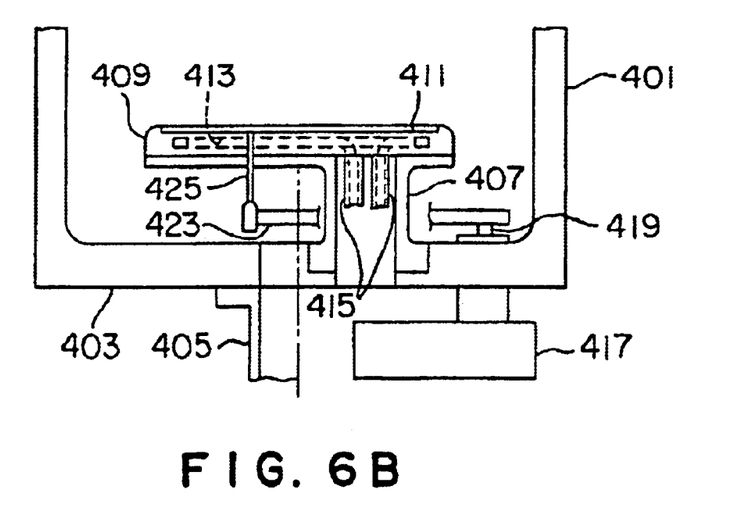

With reference to FIGS. 6A and 6B, other embodiments of the wafer support means will now be described below.

Referring to these drawings, reference numeral 401 denotes a processing vessel. Placed at the bottom of the processing vessel 401 is a bottom panel 403 which has formed an exhaust pipe 405 at its center.

In a location eccentric from the center of the bottom panel 403 where the exhaust pipe 405 exists, a cylindrical mount support member 407 extends vertically. A disk-shaped wafer mount 409 is fixed to the mount support member 407. A concavity 411 is defined in an upper surface of the wafer mount 409 such that a wafer can be set in the concavity 411.

Inside the wafer mount 409, a coolant flow path 413 extends to circulate a coolant, which is used to cool the mount. The coolant flow path 413 extends all over the outer periphery and center of the wafer mount to uniformly cool the whole wafer mount 409. The coolant flow path 413 is connected to a pair of coolant conduits 415. The pair of the coolant conduits 415 extend through the inside of the cylindrical mount support member 407 and are connected to a coolant supply means (not shown). By creating a flow of the cooing medium to and from of the wafer mount 409, the wafer can be cooled.

In a location offset from the center of the bottom panel 403, where the exhaust pipe 405 is provided, and circumferentially distant from the mount support member 407 by a predetermined angle, a pin drive mechanism 417 is fixed. The pin drive mechanism 417 has a drive source like a motor inside, and a rod 419 driven by the drive source actuate protrudes into the processing vessel 401. A main arm 421 is fixed to an upper end of the rod 419, and the main arm 421 is configured to project toward the center of the processing vessel 401. Three sub-arms 423 are provided at a distal end of the main arm 421. These three sub-arms 423 extend in radially outward directions while making the angle of 120° between every adjacent two of them. The sub-arms 423 support lift pins 425 extending upward from their respective tips. Each lift pin 425 is inserted into one of apertures made in the wafer mount. With this arrangement, by first activating the drive source inside the pin drive mechanism 417, the rod 419 is moved vertically. As the lift pins 425 are moved up and down by the sub-arms 423, the wafer set on the wafer mount 409 can be lifted or lowered.

In the wafer support means, since the mount support member 407 and the pin drive mechanism 417 are positioned off the center of the processing vessel 401 while the exhaust pipe 405 is connected to the center of the bottom panel 403, a flow line of gas exhausted from the processing vessel is formed in axial symmetry about the axis of the processing vessel. Therefore, it is prevented that the atmosphere in the processing vessel becomes uneven, and uniform processing of the wafer is ensured.

Arrangement of the Cluster Device

Explained below is an embodiment of multi-chamber cluster device composed by connecting the surface processing apparatus according to the invention to another processing apparatus (for example, a metal wiring formation chamber) via a transport chamber.

Figure 7:
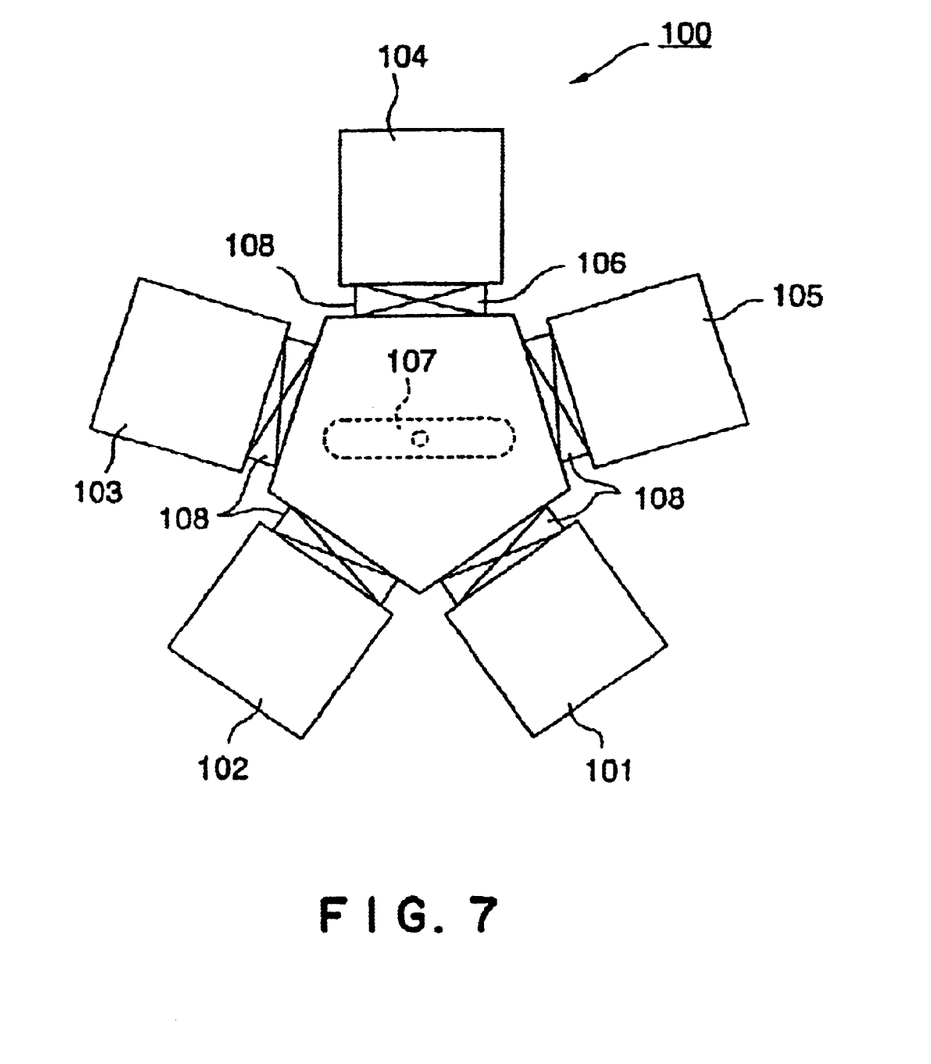
FIG. 7 is a schematic diagram of a vacuum cluster device which employs a surface processing apparatus of a preferred embodiment according to the present invention in FIG. 1 as a vacuum cleaning device in combination with a heating device, a device of forming wiring, and a cooling device.

A cluster device 100 shown in FIG. 7 uses the surface processing apparatus 1 shown in FIG. 1 as an embodiment of the processing apparatus according to the invention to function as a vacuum cleaning chamber 101, and includes the vacuum cleaning chamber 101, a heating chamber 162, one or more chambers 103 for forming metal wiring (which is configured to stack metal wirings of metals such as Al, Ti, TiN, Si, W, WN, Cu, Ta, TaN, SiN, or the like, for example, on the object to be processed), a cooling chamber 104, and a load lock chamber 105 which all are connected via gate valves 108 to the transport chamber 106 capable of maintaining an evacuated condition inside. And a transport robot 107 provided inside the transport chamber can transport the object to be processed or a semiconductor wafer between the transport chamber 106 and other chambers in a vacuum, which is a non-reactive atmosphere.

A cassette loaded with the semiconductor wafer is transported into the load lock chamber 105, and the load lock chamber 105 is evacuated. Then, the wafer is transported one by one from the load lock chamber 105 into the transport chamber 106, and the wafer is aligned in position by using an aligner such as orientation flat aligner in the transport chamber 106. Then, the wafer is sent from the transport chamber 106 into the vacuum cleaning chamber 101, and its surface is cleaned there.

Next, the wafer is exported from the vacuum chamber 101 and sent into the transport chamber 106. Thereafter, they are sent from the transport chamber 106 into the heating chamber 102, and pre-heated in the heating chamber 102.

After the wafer is exported from the heating chamber 102 and imported into the transport chamber 106, they are imported from the transport chamber 106 into the chamber 103, metal wirings of Al, Ti, or the like, are formed on the wafer by CVD in the chamber 103. Then, the wafer is exported from the chamber 13 and imported into the transport chamber 106. Thereafter, they are imported from the transport chamber 106 into the cooling chamber 104, and cooled in the cooling chamber 104.

After the wafer is exported from the cooling chamber 104 into the transport chamber 106, and then from the transport chamber 106 into the load lock chamber 105. The processed wafer sent back to the load lock chamber 105 can be exported from the load lock chamber 105 after the pressure level within the load lock chamber 105 is adjusted in the atmospheric pressure level.

The reason why the cooling chamber 104 is provided lies in that significant temperature reduction is essential and before transporting the wafer from the metal wiring formation chamber 103 usually heating wafers to approximately 500° C. for making wirings thereon into the load lock chamber 105 not tolerable beyond a temperature around 150° C.

The heating chamber 102 may be omitted if the wafer need not be heated in advance before metal wiring is formed on the wafer.

In the above-mentioned cluster apparatus, a continuous process steps from the cleaning of the wafer surface to formation of metal wirings can be carried out without exposing the wafer to the air, and development of the native oxides on the wafer can be prevented in the process steps from the cleaning to the formation of the metal wirings.

Thus, this continuous process, when applied to the wafer having contact-holes and through-holes, makes it possible to decrease resistance values at junctions between metals filling the holes and the bottoms of the holes.

Additionally, since those continuous process steps are carried out in a single cluster device, time management from cleaning to formation of metal wirings is no longer needed, and these continuous process steps ensure a high throughput.

The surface processing method and the apparatus therefor according to the present invention can enhance the reliability of final products when they are applied to the process of manufacturing semiconductor devices.

What is claimed is:

1. An apparatus for surface treatment comprising:

a processing vessel in which a substrate to be processed is placed, the processing vessel having a cylindrical side wall and a bottom wall;

an exhaust port formed at a central part of the bottom wall;

a supporting column provided on the bottom wall, the supporting column being located at a position eccentric from the exhaust port located at the central part of the bottom wall; and a substrate mount provided on the supporting column, the substrate mount being located at a central position in the processing vessel and above the exhaust port located at the central part of the bottom wall.

2. An apparatus for surface treatment according to claim 1, further comprising a substrate lifter for moving the substrate up and down, the substrate lifter including:

pins for lifting the substrate to the substrate mount;

arms for supporting the pins; and a driver for driving the arms up and down, arranged on bottom wall, spaced from the exhaust port.

3. An apparatus for surface treatment according to claim 1, further comprising a cooler for cooling the substrate on the substrate mount; the cooler including:

a coolant passage arranged in the substrate mount; and a coolant supply pipe extending through the support column to supply coolant to the coolant passage.

* * * * *